US006794277B2

United States Patent
Machida et al.

(10) Patent No.: US 6,794,277 B2
(45) Date of Patent: Sep. 21, 2004

(54) METHOD OF DOPING SEMICONDUCTOR LAYER, METHOD OF MANUFACTURING THIN FILM SEMICONDUCTOR DEVICE, AND THIN FILM SEMICONDUCTOR DEVICE

(75) Inventors: Akio Machida, Kanagawa (JP); Setsuo Usui, Kanagawa (JP); Dharam Pal Gosain, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/204,167

(22) PCT Filed: Dec. 14, 2001

(86) PCT No.: PCT/JP01/10989

§ 371 (c)(1),
(2), (4) Date: Oct. 23, 2002

(87) PCT Pub. No.: WO02/50881

PCT Pub. Date: Jun. 27, 2002

(65) Prior Publication Data

US 2003/0077886 A1 Apr. 24, 2003

(30) Foreign Application Priority Data

Dec. 18, 2000 (JP) ........................................ 2000-384122

(51) Int. Cl.$^7$ ........................... H01L 21/26; H01L 21/42
(52) U.S. Cl. ........................ 438/535; 438/513; 438/914; 438/923
(58) Field of Search ................................ 438/513, 535, 438/914, 923

(56) References Cited

U.S. PATENT DOCUMENTS

| 5,795,627 A | * | 8/1998 | Mechta et al. .............. 427/526 |
| 6,511,787 B2 | * | 1/2003 | Harada et al. ........... 430/270.1 |
| 6,538,632 B1 | * | 3/2003 | Yamazaki et al. ............ 345/98 |

FOREIGN PATENT DOCUMENTS

| JP | 4-48723 | | 2/1992 | |
| JP | 04048723 | * | 2/1992 | .......... H01L/21/22 |
| JP | 09283468 | * | 10/1997 | ......... H01L/21/285 |

* cited by examiner

*Primary Examiner*—Amir Zarabian
*Assistant Examiner*—Pamela E Perkins
(74) *Attorney, Agent, or Firm*—Sonnenschein, Nath & Rosenthal LLP

(57) ABSTRACT

A lower concentration impurity diffusion region can be formed under excellent control, even when a low heat-resistant substrate is used. At the time of doping a semiconductor layer, a mask such as sidewalls (24) where an energy beam passes through, is formed on a part of a surface of a semiconductor layer (21), dopant ions (25) are adsorbed on the surface of the semiconductor layer (21) except a region in which the mask is formed, and an energy beam EBL is irradiated onto the semiconductor layer (21) having the formed mask to introduce the dopant ions into the semiconductor layer (21). In the lower part of the mask such sidewalls (24), diffusion in transverse direction occurs and lower concentration impurity diffusion regions can be formed in excellent reproducibility under excellent control.

12 Claims, 4 Drawing Sheets

METHOD OF DOPING SEMICONDUCTOR LAYER, METHOD OF MANUFACTURING THIN FILM SEMICONDUCTOR DEVICE, AND THIN FILM SEMICONDUCTOR DEVICE

TECHNICAL FIELD

The present invention relates to a method of doping a semiconductor layer, a method of manufacturing a thin film semiconductor device, and a thin film semiconductor device, and more particularly, a doping method using a crystallized semiconductor layer by excimer laser anneal, a method of manufacturing a thin film semiconductor device such as a thin film transistor, a thin film semiconductor device in which a semiconductor layer made of a material such as polycrystalline silicon is used as a channel.

BACKGROUND OF THE INVENTION

With progress of an advanced information age, the importance of input/output devices is increasing rapidly and the devices are in demand to include advanced and sophisticated features. Furthermore, the spread of personal digital assistant machines is remarkable in recent years, and consequently, the technology of producing TFT on a plastic substrate with more excellent weight saving, flexibility, and nondestructive evaluation rather compared with the conventional glass substrates is desired. In such a situation, research and development of active matrix liquid-crystal-display devices (AM-LCD) using a thin film transistor (TFT) and contact type image sensors (CIS) and the like are actively done.

The thin film transistors, in which a semiconductor film made of silicon is used as a channel, can be classified by a material used in order to construct a carrier-transporting layer (active layer), that is, a semiconductor film made of amorphous silicon (a-Si) and a semiconductor film made of polycrystalline silicon having a crystal phase. Polysilicon (poly-Si) or microcrystal silicon ($\mu$c-Si) is mainly known as the polycrystalline silicon.

Semiconductors made of the polycrystalline silicon such as polysilicon (poly-Si) or microcrystal silicon ($\mu$c-Si) are characterized by the carrier mobility from about 10 to 100 times as high as that of semiconductors made of amorphous silicon, and have very excellent features as a composition material of switching elements. Moreover, the thin film transistors using the polycrystalline silicon for the active layer allow high-speed operation, and therefore are getting most of the attention as the switching elements constituting various logical circuits (for example, a domino logic circuit, a CMOS (Complementary Metal Oxide Semiconductor) transmission gate circuit), multiplexers using these circuits, EPROM (Erasable and Programmable Read Only Memory), EEPROM (Electrically Erasable and Programmable Read Only Memory), CCD (Charge Coupled Device), RAM (Random Access Memory), drive circuits of displays such as a liquid crystal display and an electroluminescent display, and the like in recent years. Moreover, in recent years, remarkable are active matrix type liquid crystal displays employing the thin film transistor (TFT), using such polysilicon for a channel semiconductor film, as the switching element and as a surrounding drive circuit. This is because the constitution of a thin film transistor array, making use of a polysilicon semiconductor film which can be formed at low temperature on a cheap amorphous glass substrate, may allow to implement reflected type panel displays or wide, high-finesse, high-definition, cheap panel displays (for example, a flat type television).

On the other hand, when using poly-Si TFT in switching elements for pixel selection of the liquid crystal display or the like, the OFF state current is high and display quality is low, which is a problem. In MOS transistors using single crystal silicon so far, in a gate reverse bias, a leakage current does not increase, since the channel became in opposite polarity with a source or a drain, a depletion layer is formed and enough pressure-proofing and rectification property can be shown. However, with the poly-Si TFT, a problem arises that a high leakage current occurs since electric current flows through the grain boundary of crystalline particles composing the semiconductor film or through the defect of the particles themselves. Furthermore, since the MOS transistors are not used under very high gate reverse bias, the leakage current has not become a problem. However, in the poly-Si TFT, for example used for the active matrix type liquid crystal displays, the leakage current poses a big problem since it is used under the reverse bias of about 10 V or more. Such a problem is especially important when the poly-Si is used for the thin film transistor for pixel selection of the liquid crystal displays.

In order to reduce the leakage current, it is effective to relax the electric field in the drain edge, and it has been known that LDD (Lightly Doped Drain) structure is effective (General Conference of The Institute of Electronics and Communication Engineers, 2–20, pp. 271, 1978). The structure forms the region which activated the impurities under a low dose such as $1 \times 10^{14}/cm^2$ or less in the edge part of the drain region, and relaxes the electric field in the edge part of the drain region.

The thin film transistor having the LDD structure is formed, for example, by the following processes so far. First, as shown in FIGS. 5A to 5C, an amorphous silicon containing hydrogen (a-Si:H) film is formed on a glass substrate 101, and dehydrogenation is performed by the lamp anneal. Then, a polysilicon (poly-Si) semiconductor film 102 is formed by crystallizing the amorphous silicon film using laser irradiation. Then, a gate insulating film 103 and a gate electrode 104 are formed, and heavy doping of impurity ions is performed by using the gate electrode 104 as a mask (FIG. 5A), where the gate electrode 104 has already been patterned to cover a channel region and an LDD region. Subsequently, the gate electrode 104 is again patterned to cover only the channel region. And light doping of impurity ions is performed by using the re-patterned gate electrode 104 as a mask. Consequently, source drain regions 105a and 105a are formed to have the LDD structure with low concentration impurities regions 105b and 105b formed on the sides of the channel region. Then, an interlayer insulating film 106, contact holes 106a, and wiring layers 107 are formed, and the wiring layers 107 are connected to the source drain regions 105a and 105a through the contact holes 106a. More particularly, such processes have been disclosed in Japanese Unexamined Patent Application No. 2000-228526.

When forming the thin film transistor having the LDD structure by such a method, there is a problem of the difference or the variation in lengths of the LDDs on both sides of the channel region (thicknesses of the LDD regions between the channel region and contact regions) due to deviation of the mask during patterning of the gate electrode 104, and the like. This causes other problems that the properties of the thin film transistor vary and the productivity of the thin film transistor decrease. Moreover, the LDD lengths should not be set to about 2 $\mu$m or less in order to secure a mask alignment margin. For this reason, the resistance of the low concentration impurities regions 105b and 105b performing as the LDD regions becomes high, and the carrier mobility decreases, which is a problem. Therefore, in a self-alignment type process where the controllability of the LDD lengths is good, it is important to develop a certain process where the controllability is enough at a low dose such as $1\times10^{14}/cm^2$ or less.

By the way, as for the poly-Si TFT, the highest process temperature reaches about 1000° C. in the manufacturing process. Therefore, silica glasses or the like having an excellent heat-resistant property are used as an insulating substrate for the poly-Si TFT manufacturing. That is, it can be difficult in the manufacturing process to use a glass substrate with a comparatively low melting point. However, for a cost reduction of the liquid crystal displays, the use of the glass plate materials with a low melting point is indispensable. Then, in recent years, the development of the so-called low temperature process with the highest process temperature reaching 600° C. or below is making progress, and the production of such devices is practically done. Furthermore, recently, using a plastic plate to easily form a larger area under lower temperature has been also examined. The deformation temperature of the plastic plate is at most 200° C., even when formed from a heat-resistant material. Therefore, when the substrate is formed from the plastic, all processes must be performed on the condition of super low temperature as compared with the conventional conditions, that is, at 200° C. or below.

With the larger type of liquid crystal display, in the low temperature process for the poly-Si TFT, the ion doping and the plasma doping, which allow doping impurities into the semiconductor thin film with a large area with a fine throughput, are used. The ion doping is the method of ionizing an impurity gas and then irradiating the impurity ions all at once onto the large area semiconductor thin film by accelerating electric field without performing a mass separation. The plasma doping is the method of ionizing an impurity gas and a deposition gas simultaneously, and deposit including the impurity ions on the substrate surface. On the other hand, ion implantation is the method of performing the mass separation of impurity ions, producing an ion beam of the separated ions and irradiating the ion beam onto the semiconductor thin film. Although the ion doping and the plasma doping are advantageous to the formation of the larger area type, these processes pose problems that the film can contain hydrogen in large quantities which can blow off and break the film at the time of crystallization by the excimer laser (ELA: Excimer Laser Anneal), and that it is difficult to perform the lower temperature process using the plastic plate or the like at the required temperature for dehydrogenation (400° C.). Moreover, there is also a problem that these methods are not suitable for the self-alignment type process in principle.

By the way, the Laser-Induced Melting of Predeposited Impurity Doping (LIMPID) attracts attention recently as being a method in which doping can be done in a process at 200° C. or below. The LIMPID is the method of ionizing an impurity gas, adsorbing the impurity ions on the semiconductor thin film surface, and melting the ions into the film with an excimer laser, and attracts attention not only because the hydrogen cannot be entrapped into the film, but also because it is most appropriate to the self-alignment process as well as to the low temperature process (refer to Japanese Unexamined Patent Application No. SHO 61-138131, Japanese Unexamined Patent Application No. SHO 62-002531, Japanese Unexamined Patent Application No. SHO 62-264619, and Japanese Unexamined Patent Application No. HEI 9-293878).

With the LIMPID, the high dose such as from about $1\times10^{15}$ to $1\times10^{16}/cm^2$ of the impurities can be electrically activated in the semiconductor thin film. However, in principle, it is difficult to precisely control the dose of $1\times10^{14}/cm^2$ or less of the impurities. Because the high dose of from about $1\times10^{15}$ to $1\times10^{16}/cm^2$ of the impurities is activated by the excimer laser anneal, even when, for example, the impurity ions of an atomic layer are adsorbed on the top of a Si surface. Furthermore, since the adsorption of the impurity ions of the atomic layer occurs for an extremely short time in the conventional methods, the control at the low dose is difficult.

On the other hand, the conventional ion implantation is the most appropriate to the self-alignment process and enables also the control at the low dose. Since the temperature of the substrate generally increases in the process for the silicon substrate, the method of attaching a cooling plate by the electrostatic chuck of the substrate and radiating heat from the back side is taken in the process. However, it is difficult to apply such a method to the plastic plate considering the thermal conductivity and electrical conductivity of the plastic plate. Moreover, there are other problems that the impurities cannot be implanted into the semiconductor thin film with the large area all at once, and that the throughput gets worse in the manufacturing the large-sized liquid crystal displays.

Moreover, in the crystallization process with the laser, since irradiation time is about 30 ns which is extremely short, solid phase diffusion cannot occur, but only liquid phase diffusion can occur. In such a case, a steep junction is formed at the boundary between the channel and the source drain region. Therefore, the problems of grain boundary leak and hot electrons are remarkable compared with the processes using the furnace anneal and lamp anneal in which solid phase diffusion can occur. Therefore, when a laser activation process like the process for the low heat-resistant substrate is required, it becomes indispensable to form the LDD structure under excellent control.

The present invention has been achieved in view of the above problems. It is an object of the invention to provide a method of doping a semiconductor layer which can form a lower concentration impurity diffusion region under excellent control even when a low heat-resistant substrate is used, a method of manufacturing a thin film semiconductor device, and a thin film semiconductor device.

SUMMARY OF THE INVENTION

A method of doping a semiconductor layer according to the invention comprises the steps of forming an energy beam permeable mask on a part of a surface of a semiconductor layer, adsorbing dopant ions on a surface of the semiconductor layers except a region in which the mask is formed, and introducing the dopant ions into the semiconductor layer with irradiation of an energy beam onto the semiconductor layer having the formed mask.

According to the method of doping the semiconductor layer of the invention, while the dopant ions adsorbed on the surface of the semiconductor layer diffuse in the semiconductor layer by the irradiation of the energy beam, the mask is constituted so that the energy beam may pass through, and therefore the region where the energy beam is irradiated through the mask as well as the region where the energy beam is directly irradiated is fused by the irradiation of the energy beam. Therefore, diffusion of the impurities in transverse direction arises from the surfaces of the regions other than the mask, but the impurities concentration in the mask area become smaller, since the area is more separated from the sources of the diffusion of the adsorbed ions compared with the regions where the energy beam is directly irradiated, and a lower concentration impurity diffusion region can be formed in the semiconductor layer with sufficient accuracy.

Moreover, a method of manufacturing a thin film semiconductor device of the invention comprises the steps of forming a convex part on a surface of a semiconductor layer along with an insulating film in between, forming an energy beam permeable mask around the convex part, adsorbing dopant ions on a surface of the semiconductor layer except a region in which the mask is formed, and introducing the dopant ions into the semiconductor layer with irradiation of an energy beam onto the semiconductor layer having the formed mask.

Other and further objects, features and advantages of the invention will appear more fully from the following description.

BRIEF DESCRIPTION OF THE DRAWINGS

FIG. 1A is a view illustrating the steps until forming a $SiO_2$ film, FIG. 1B is a view illustrating the steps until depositing a gate electrode layer, and FIG. 1C is a view illustrating the steps until patterning a gate electrode layer.

FIG. 2A is a view illustrating the steps until forming a sidewall, FIG. 2B is a view illustrating the steps until adsorbing a dopant, and FIG. 2C is a view illustrating the steps until irradiating an energy beam.

DETAILED DESCRIPTION OF THE PRESENTLY PREFERRED EMBODIMENTS

An embodiment of a method of doping a semiconductor layer according to the invention will be described in detail hereinbelow with reference to FIGS. 1A to 3. The doping method is a process which can form a lower concentration impurity diffusion region even on a silicon layer formed on a low-heat-resistant insulating substrate such as plastic under excellent control. According to the embodiment, in order to compose a thin film semiconductor device used as an active element substrate of an active matrix type display, an n-channel type thin film transistor is formed on an insulating substrate.

Figure 1A:
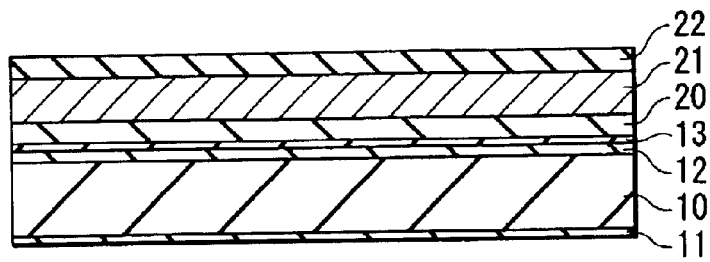
FIGS. 1A to 1C are views illustrating the steps in a method of doping a semiconductor layer according to an embodiment of the invention.

First, as shown in FIG. 1A, according to the embodiment, especially the so-called plastic material made of an organic polymeric material as a low heat-resistant material is used as an insulating substrate 10, while it is also possible to use glass substrates such as a silica glass substrate and a white plate glass substrate. The plastic material used herein may include polyesters such as a polyethylene terephthalate, polyethylenenaphthalate, and polycarbonate, polyolefines such as polypropylene, polyphenylene sulfides such as polyphenylene sulfide, polyamides, aromatic polyamides, polyether ketones, polyimides, acrylic resins, PMMA (Polymethyl Methacrylate), and the like. Especially it is preferred to use a general-purpose plastic material such as polyethylene terephthalate, acetate, polyphenylene sulfide, polycarbonate, polyether sulfone, polystyrene, nylon, polypropylene, polyvinyl chloride, the acrylic resins, PMMA, and the like.

Moreover, when using a film type as the insulating substrate 10, it is preferred that the film is extended by biaxial stretching in the light of mechanical stability and strength. Furthermore, a barrier layer 11 such as a silicon oxide film can be formed on the back side of the substrate for suppressing the hygroscopic property of the plastic plate. Therefore, deformation of the insulating substrate 10 can be suppressed in exposure to atmospheric pressure after being taken out of a vacuum apparatus and in the subsequent processes. As shown in FIG. 1A, a barrier layer 12 of silicon oxide can be formed on the front side of the insulating substrate 10 made from the plastic, which is more effective.

Moreover, it is desirable to pre-form a thermal buffer layer 13 on the insulating substrate 10. As the thermal buffer layer 13, it is preferred to form an inorganic material film such as a $SiO_2$ film or a $SiN_x$ film with a thickness of about 100–500 nm. At this time, it is more effective that a multilayer structure is constructed by forming another buffer layer 20, of an organic polymeric material such as an acrylic resin with a thermal softening point lower than that of the substrate, on the buffer layer 13, for the purpose of preventing film separation at the time of energy beam irradiation owing to the difference in the thermal expansion between the organic polymeric material of the insulating substrate 10 and the inorganic material.

Then, an amorphous semiconductor thin film which serves as an active layer of the transistor is formed on the side of the upper surface of the plastic substrate on which such buffer layers 13 and 20 for heat-resistant are already formed. According to the embodiment, the amorphous semiconductor thin film is deposited to a thickness of about 20–100 nm using a sputtering apparatus as a deposition apparatus, at the substrate temperature set to 200° C. or below, preferably 150° C. or below, where the insulating substrate 10 may not be damaged.

Then, a polycrystal semiconductor thin film 21 is formed by irradiating an energy beam, for example, an excimer laser, onto the insulating substrate 10 and crystallizing the amorphous semiconductor thin film. Also in the crystallization by the irradiation of the excimer laser, optimization of both time and the irradiation energy of the laser is required so that the temperature of the plastic of the insulating substrate 10 is kept at 200° C. or below, preferably 150° C. or below, where the plastic plate may not be damaged. At this time, it is desirable to irradiate repeatedly the laser beam, for example, while the line-shaped laser beam, which energy density is set at about 300 mJ/cm$^2$, is scanning the substrate so that the irradiated parts partially overlap. The size of the line-shaped laser beam is, for example, 120 mm in longitudinal size and 0.5 mm in width. The laser beam is irradiated along the width direction so that the irradiated parts partially overlap, where the amount of the overlapping part (the overlapping amount) is set to 98%, for example.

Then, a $SiO_2$ film 22 used as a gate insulating film is formed on the upper surface of the polycrystal semiconductor thin film 21 by reactive sputtering. Alternatively, another $SiO_2$ film may be subsequently formed on a $SiN_x$ film which is formed on the $SiO_2$ film 22 and the stacked film may be used as a gate insulating film.

Figure 1B:
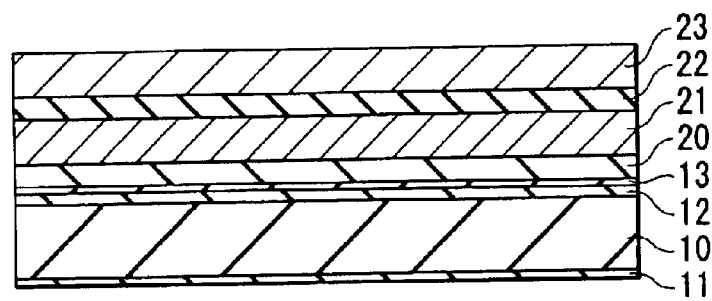
Figure 1C:
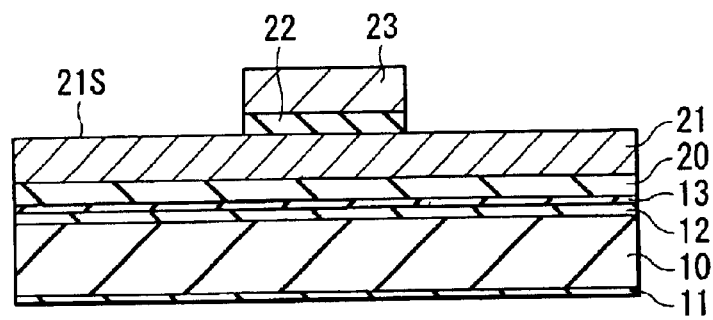

Then, a gate electrode layer 23 is formed on the $SiO_2$ film 22 as shown in FIG. 1B, and the gate electrode layer 23 is patterned into a required gate electrode form as shown in FIG. 1C. The gate electrode layer 23 can be built by depositing a metal film such as Al (aluminum), Mo (molybdenum), Ta (tantalum), Ti (titanium), Cr (chromium) or the like, a polysilicon film into which high concentration of impurities are doped, a laminated film of high concentration doped polysilicon and a metal, or an alloy film of the above mentioned materials.

Then, the gate insulating film is formed by patterning the $SiO_2$ film 22 into an island-shape using the gate electrode layer 23 as a mask. And, sidewalls are formed for production of lower concentration impurity diffusion regions, i.e., LDD regions, adjacent to a channel region. First, the $SiO_2$ film 22 is deposited on the whole surface including the top of the gate electrode layer 23 forming a convex part on the semiconductor layer, for example, by PE-CVD.

Figure 2A:
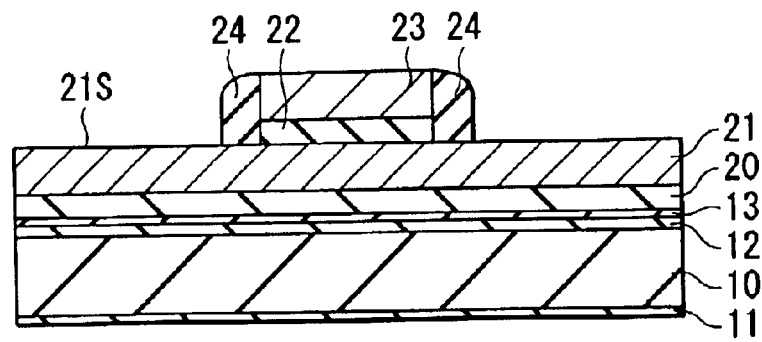
FIGS. 2A to 2C are views illustrating the steps in the method of doping the semiconductor layer according to an embodiment of the invention, following the steps shown in FIG. 1C.

After an appropriate time, anisotropic etching (for example, reactive ion etching (RIE)) is performed by using the gate electrode layer 23 made of, for example, polysilicon as an etching stopper. Thereby, as shown in FIG. 2A, the sidewalls 24 and 24 are formed on the gate electrode layer 23 and the side walls of the $SiO_2$ film 22 which is the gate insulating film. In relation to the size of these sidewalls 24 and 24, the size of the bottom in the longitudinal direction of the channel is preferably from about 100 to 200 nm, more preferably from about 125 to 175 nm. In addition, the sidewalls 24 and 24 are formed from the $SiO_2$ film in the embodiment, while it is possible to utilize various films such as a $SiN_x$ film and a combination of a $SiO_2$ film and a $SiN_x$ film. The sidewalls 24 and 24 may also be formed not only by single etching but also by a combination of two or more etchings.

Here, although the sidewalls 24 and 24 function as a mask, when an energy beam is irradiated, the energy beam passes through the sidewalls 24 and 24 and simultaneously is attenuated. Therefore, the lower concentration impurity diffusion regions can be formed in excellent reproducibility by utilizing the energy beam passing through the sidewalls 24 and 24 as described later.

Figure 2B:
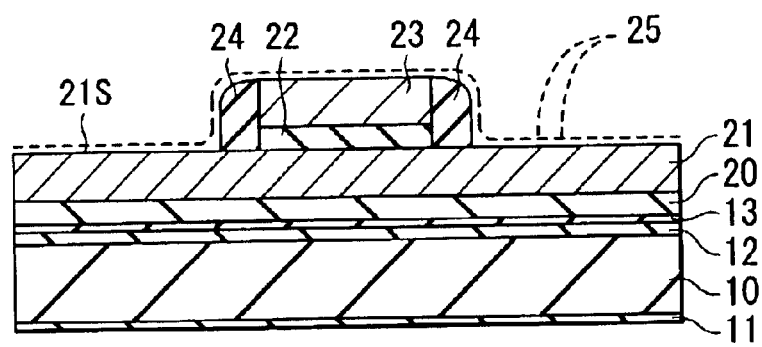

After forming the sidewalls 24 and 24 as mentioned above, plasma is generated using a hydrogen gas or a gaseous mixture of an inert gas and a hydrogen gas as a doping gas, to adsorb dopant ions 25 on the surface of the semiconductor thin film as shown in FIG. 2B. According to the embodiment, the substrate temperature is set to, for example, 120° C., the plasma irradiation is performed for about 1 minute, at 66.7 Pa (500 mTorr) and 20 W using a RF power supply, and using a doping material gas of the mixture of 9 sccm of $PH_3$ gas (which is diluted to 1% of phosphine with $H_2$) and 50 sccm of diluted argon gas, in order to adsorb phosphorus ions as the dopant ions 25. In the adsorption process, the quantity of the dopant ions 25 adsorbed on the surface of the polycrystal semiconductor thin film 21 can be regulated by controlling the flow rate of the diluted gases. Moreover, it is also possible to change the substrate temperature, to dilute further the gaseous mixture of the dopant gas of the dopant ions 25 and the hydrogen-containing gas with an inert gas, and further to control the conditions of the plasma irradiation for the adsorption such as the plasma irradiation time and the substrate temperature.

Moreover, it is also possible to remove the dopant ions 25 adsorbed on the surface of the polycrystal semiconductor thin film 21 by a method such as etching, and to control the quantity of the dopant ions 25 adsorbed on the surface of the polycrystal semiconductor thin film 21 by adding a hydrogen plasma treatment process.

Figure 2C:
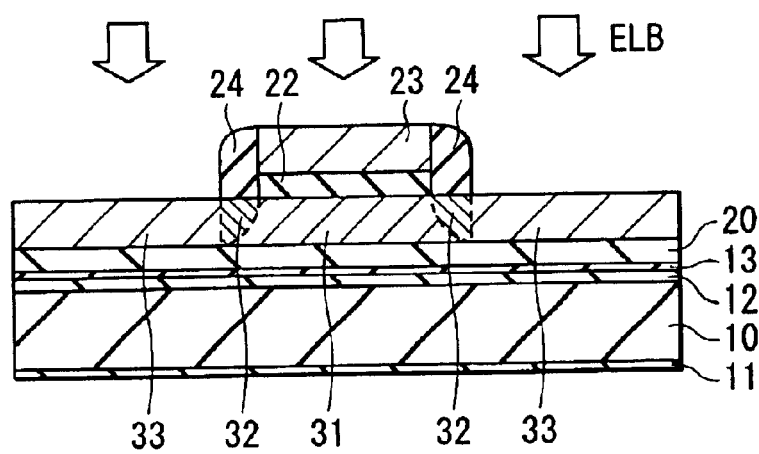

Then, an energy beam is irradiated to melt the dopant ions 25 adsorbed on the surface of the polycrystal semiconductor thin film 21 into the film and activate the dopant ions 25 as shown in FIG. 2C. It is desirable to use a XeCl excimer laser ELB of wavelength of 308 nm as the above energy beam, more desirable to use a laser having higher energy than the one used in the crystallization (microcrystalization) of the semiconductor thin film. In the embodiment, the energy density of the laser beam is set, for example, to about 310 $mJ/cm^2$.

In addition, as the energy beam, it is possible to use a light source such as an excimer laser, a carbon dioxide laser, a YAG laser, electron rays, and ultraviolet rays. For example, an ArF excimer laser, a XeF excimer laser, a XeCl excimer laser, a KrF excimer laser or the like can be used when using an excimer laser. In addition, although the means of activating the dopant ions include using the energy beams such as an excimer laser, without the limit to the above methods, it is possible to use heating means such as a lamp anneal and a furnace anneal.

In the case of the irradiation of the beam of the excimer laser such as the XeCl excimer laser, the dopant ions 25 adsorbed on the surface of the polycrystal semiconductor thin film 21 are immediately introduced, from the surface of the areas except the gate electrode layer 23 and the sidewalls 24 and 24, into the polycrystal semiconductor thin film 21 fused to the liquid phase during the beam irradiation. Consequently, phosphorus of high concentration is introduced into the areas except the gate electrode layer 23 and the sidewalls 24 and 24. On the other hand, in the lower part of the sidewalls 24 and 24, although the temperature is not raised high unlike the areas except the gate electrode layer 23 and the sidewalls 24 and 24, diffusion at relatively lower temperature occurs because of the transmission of the excimer laser beam through the sidewalls 24 and 24 composed of the $SiO_2$ film, and diffusion in the transverse direction occurs especially from the areas except the gate electrode layer 23 and the sidewalls 24 and 24. In the lower part of the sidewalls 24 and 24, a concentration distribution arises from the diffusion in transverse direction, and the concentration distribution is established so that the concentration gradient of 10 times or more may arise in the lower part of the sidewalls 24 and 24. In the embodiment, when the excimer laser passes through the sidewalls 24 and 24 formed as a mask, the excimer laser beam is attenuated by the sidewalls 24 and 24, and the temperature state which is the most suitable for the diffusion of the low concentration impurities can be generated.

The amount of diffusion and diffusion region in transverse direction are determined by the irradiation energy and the number of irradiation at the time of the energy beam irradiation. Hereby, the polycrystal semiconductor thin film 21 except the areas masked by the gate electrode layer 23 and the sidewalls 24 and 24 is activated in the high dose to form higher concentration impurity diffusion regions 33 and 33, and the impurities are diffused to form a gradient of slowly lower concentration from the source drain side of lower dose to a channel region 31 in the lower part of the sidewalls 24 and 24, where lower concentration impurity diffusion regions 32 and 32 are constituted. According to the embodiment, although the same dopant such as phosphorus is used for the formation of the higher concentration impurity diffusion regions 33 and 33 and the lower concentration impurity diffusion region 32 and 32, it is possible to adsorb several different dopants and diffuse the dopants into the polycrystal semiconductor thin film 21.

Figure 3:
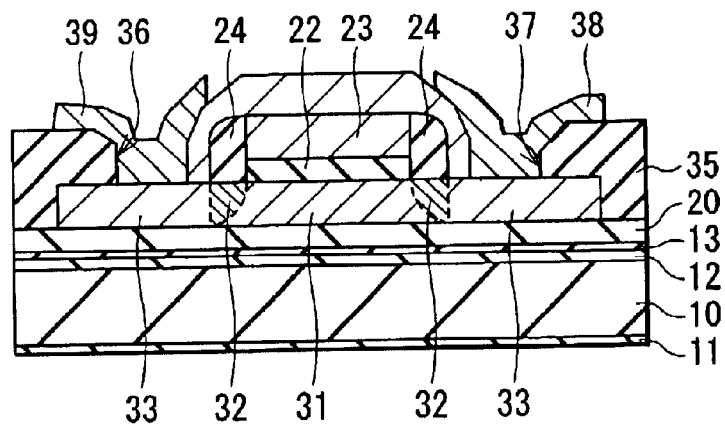
FIG. 3 is a view illustrating the steps in the method of doping the semiconductor layer according to an embodiment of the invention, following the steps shown in FIG. 2C and illustrating the steps until forming a wiring.

After activating the impurity diffusion regions by these diffusions, as shown in FIG. 3, an interlayer insulating film 35 is formed and the required contact holes 36 and 37 are formed in the interlayer insulating film 35. Then, an aluminum film is formed to a thickness of 1000 nm on the interlayer insulating film 35, and is patterned into a predetermined shape to form wiring layers 38 and 39. These wiring layers 38 and 39 are connected to the source drain regions (the higher concentration impurity diffusion regions 33 and 33) of the thin film transistor through the contact holes 36 and 37. Subsequently, although not illustrated, a $SiO_2$ film is formed to a thickness of about 400 nm to form a passivation film. The passivation film covers the thin film transistor and the wiring layers 38 and 39. Then, if required, the so-called hydrogenation treating is carried out by heating the substrate in the region of a heat resistant temperature of a substrate, and diffusing the hydrogen atoms contained in the interlayer insulating film 35 into the semiconductor thin film by using a passivation film as a cap film.

The manufacturing method of the invention, in which the lower concentration impurity diffusion region is formed by irradiating the energy beam with passing through such sidewalls and diffusing the dopant adsorbed on the surface of the thin film semiconductor in transverse direction, can preferably be applied for TFT of the display as described below.

Figure 4:
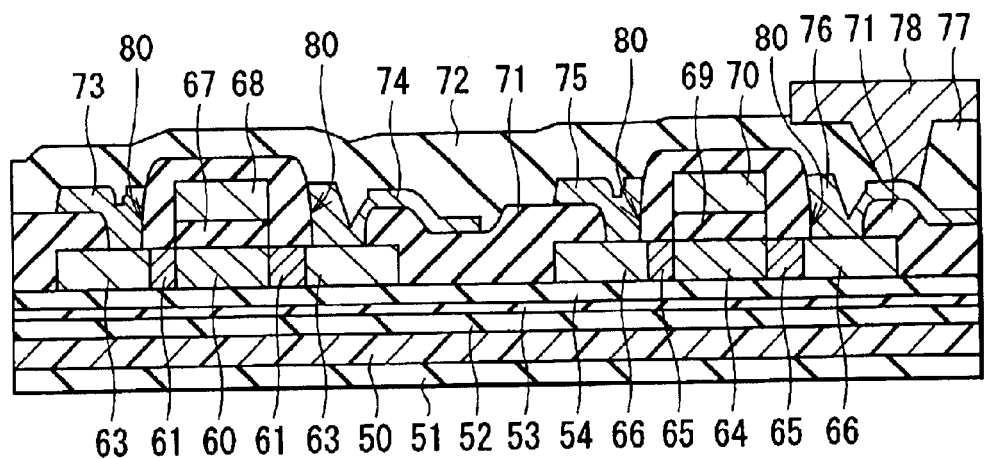
FIG. 4 is a sectional view showing a device structure of a thin film transistor in a liquid crystal display formed by an embodiment of a method of manufacturing a thin film semiconductor device of the invention.
Figure 5A:
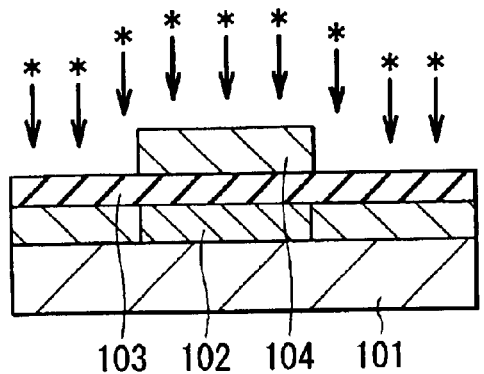
FIGS. 5A to 5C are views illustrating the steps of the method of manufacturing a TFT using the conventional processes.
Figure 5B:
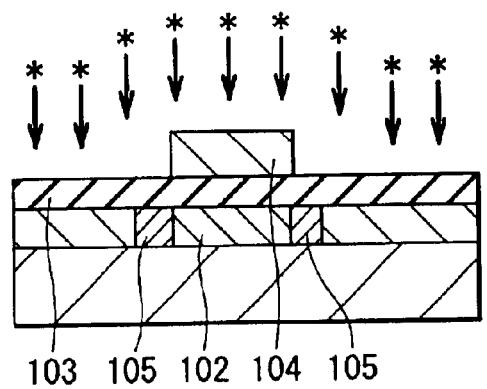
Figure 5C:
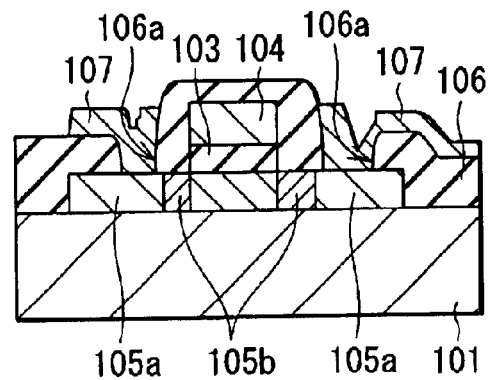

FIG. 4 is a sectional view of a device in the case of composing an active matrix type display. Barrier layers 51 and 52 made of, for example, $SiO_2$ are formed on both sides of an insulating substrate 50 made from plastic, and a thermal protection buffer layer 53 is deposited on one of the barrier layers or the barrier layer 52. On the thermal protection buffer layer 53, an insulating film 54 made of, for example, an acrylic resin is formed, and a semiconductor thin film having higher concentration impurity diffusion regions 63, 63, 66, and 66 and lower concentration impurity diffusion regions 61, 61, 65, and 65 is formed on the insulating film 54.

Gate electrodes 68 and 70 are respectively formed on a channel region 60 between the lower concentration impurity diffusion regions 61 and 61, and a channel region 64 between the lower concentration impurity diffusion regions 65 and 65, together with oxidized silicon films 67 and 69 in between, and sidewalls 80 and 80 are formed on the side parts of these gates electrodes 68 and 70, respectively. Since the sidewalls 80 and 80 function as the energy beam permeable mask as described above, at the time of the irradiation of the energy beam, the diffusion in transverse direction occurs in the region of the lower concentration impurity diffusion regions 61, 61, 65, and 65, which provides the concentration distribution in the lower parts of the sidewalls 80 and 80 producing 10 times or more the concentration gradient.

Wiring electrode layers 73, 74, 75, and 76 are connected to a source drain region composed of the higher concentration impurity diffusion regions 63, 63, 66, and 66 of the thin film transistor, through contact holes located in interlayer insulating films 71 and 72. A transparent conductive film made of ITO (Indium Tin Oxide) or the like is formed on the surface of a passivation film 77, and patterned into a predetermined shape to form a pixel electrode 78. The pixel electrode 78 is connected to the wiring electrode layer 76 and the source drain region of the thin film transistor, through a contact hole opened on the passivation film 77. In addition, the active matrix type liquid crystal display comprising the above thin film semiconductor device as the active element substrate may be composed by joining another insulating substrate, on which a counter electrode is preformed, to the insulating substrate 60 at a predetermined gap, and locating an electrooptic material such as liquid crystal in the gap.

As mentioned above, according to the method of doping the semiconductor layer of the invention, even when the low heat-resistant substrate is used, it is possible to form the lower concentration impurity diffusion regions using the mask where the energy beam passes through under excellent control, and especially, it is possible to form the low concentration impurity regions of the LDD structure in the thin film transistor under excellent control.

Obviously many modifications and variations of the present invention are possible in the light of the above teachings. It is therefore to be understood that within the scope of the appended claims, the invention may be practiced otherwise than as specifically described.

What is claimed is:

1. A method of doping a semiconductor layer comprising the steps of:

forming an energy beam permeable mask on a part of a surface of a semiconductor layer;

adsorbing dopant ions on a surface of the semiconductor layer except a region in which the mask is formed; and introducing the dopant ions into the semiconductor layer with irradiation of an energy beam onto the semiconductor layer having the formed mask, wherein the semiconductor layer is a semiconductor thin film on an insulating substrate, wherein the insulating substrate is a low heat-resistant substrate of which heat-resistant temperature is 200° C. or below, and wherein the low heat-resistant substrate is an organic polymeric material substrate.

2. A method of doping a semiconductor layer according to claim 1, wherein a higher concentration impurity region is formed within the semiconductor layer except the region in which the mask is formed, and a lower concentration impurity region compared with the higher concentration impurity region is formed within the semiconductor layer in the region where the mask is formed.

3. A method of doping a semiconductor layer according to claim 2, wherein a concentration distribution in the lower concentration impurity region is produced by diffusion in transverse direction.

4. A method of doping a semiconductor layer according to claim 3, wherein 10 times or more concentration gradient is produced as the concentration distribution within the lower concentration impurity region.

5. A method of doping a semiconductor layer according to claim 1, wherein plasma made of a dopant gas without substantially containing a semiconductor deposition gas is used for adsorbing dopant ions on the surface of the semiconductor layer.

6. A method of doping a semiconductor layer according to claim 1, wherein silicon is used as a main material of the semiconductor layer.

7. A method of doping a semiconductor layer according to claim 1, comprising the step of crystallizing the semiconductor layer before the step of adsorbing the dopant ions.

8. A method of doping a semiconductor layer according to claim 1, wherein at least single heat-resistant layer is formed on the organic polymeric material substrate.

9. A method of doping a semiconductor layer according to claim 1, wherein the dopant ions are phosphorus ions.

10. A method of doping a semiconductor layer according to claim 1, wherein the irradiation of the energy beam is carried out by irradiation of a laser beam.

11. A method of doping a semiconductor layer according to claim 1, wherein the laser beam is an excimer laser.

12. A method of doping a semiconductor layer according to claim 1, wherein the dopant ions are activated with a laser anneal, a furnace anneal, a lamp anneal or any combination thereof.

* * * * *